United States Patent [19]
Hammel

[11] Patent Number: 5,949,136
[45] Date of Patent: *Sep. 7, 1999

[54] HIGH PERFORMANCE DEBUG I/O

[75] Inventor: Samuel K. Hammel, Fort Collins, Colo.

[73] Assignee: Hewlett-Packard Company, Palo Alto, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/551,259

[22] Filed: Oct. 31, 1995

[51] Int. Cl.⁶ .................................................. H01L 23/50
[52] U.S. Cl. .......................... 257/693; 257/697; 257/778; 257/48
[58] Field of Search ............................. 257/643, 48, 778, 257/697

[56] References Cited

U.S. PATENT DOCUMENTS 5,041,899  8/1991  Oku et al. ............................ 257/693
5,306,948  4/1994  Yamada et al. ...................... 257/690

FOREIGN PATENT DOCUMENTS 60-136344  7/1985  Japan ..................................... 257/693
1-49693    2/1989  Japan ..................................... 257/48
3-157962   7/1991  Japan ..................................... 257/697

*Primary Examiner*—Donald L. Monin, Jr.
*Attorney, Agent, or Firm*—Cynthia S. Deal

[57] ABSTRACT

A semiconductor with dedicated wire bond sites that are routed and via'd only to a top surface of a semiconductor package to flush mount pads where they are probed during debug, thus reducing the overall inductance and capacitance of the path from the wire bond site to the debug probing site over conventional debug testing by means of dedicated pins on the semiconductor package. This design permits higher performance debug data capture, while at the same time decreasing the number of pads and pins that are necessary for debug.

6 Claims, 3 Drawing Sheets

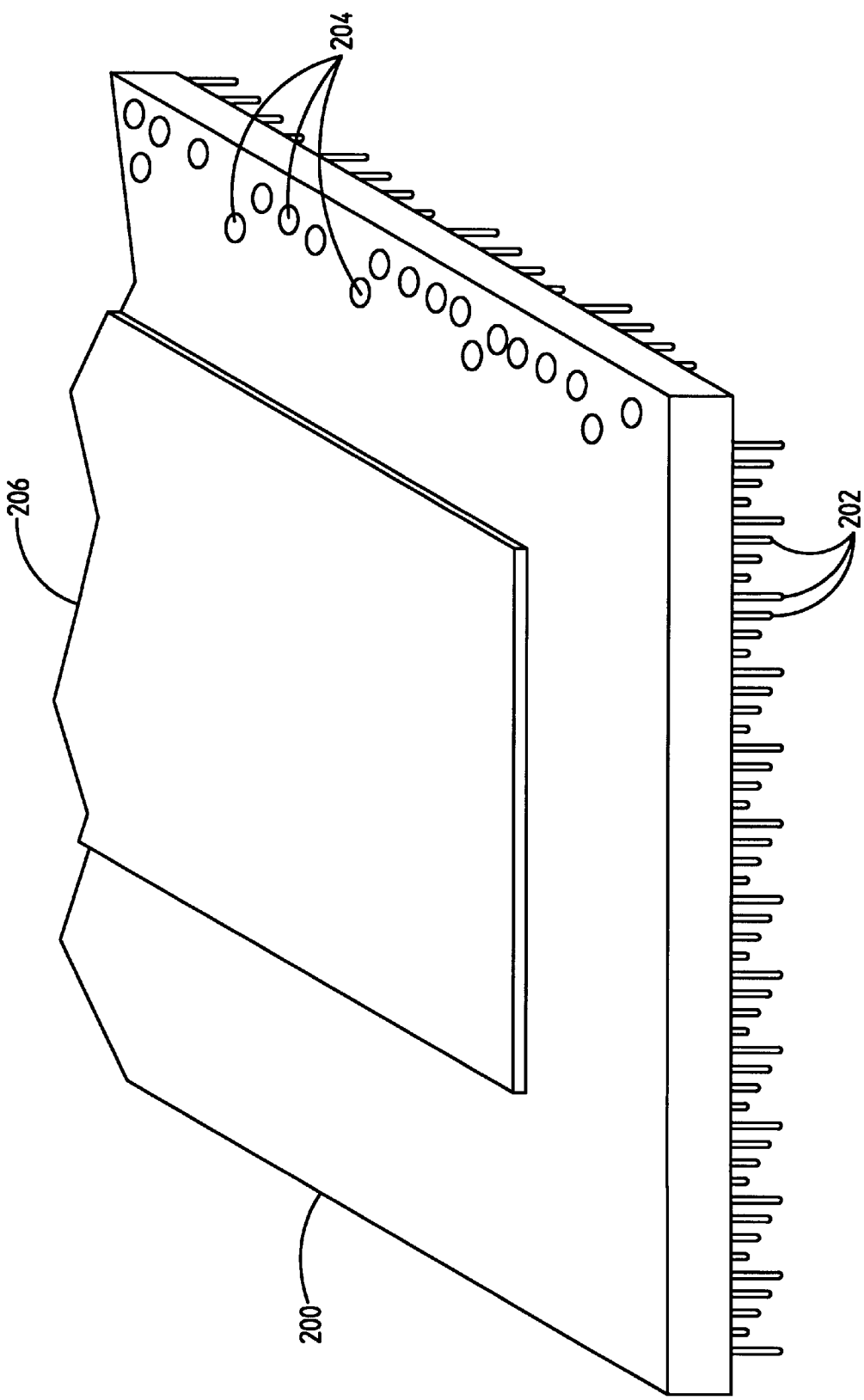

HIGH PERFORMANCE DEBUG I/O

FIELD OF THE INVENTION

The present invention relates generally to the field of semiconductor devices and more particularly to semiconductor package design. In particular, this invention provides an advanced I/O debug design on a high pin count package.

BACKGROUND OF THE INVENTION

In semiconductor circuit devices, finer pattern techniques are being developed and integration densities are increasing every year. One of the dominant limiting factors with the decreasing size and increasing densities is package pin count. Accordingly, circuit designers are generally searching for ways to increase the density inside a package and at the same time conserve precious I/O pins. One area that circuit designers have been trying to conserve I/O pins is in the area of debug I/O.

One currently used method to conserve debug I/O pins is phase muxing onto existing busses, which involves debug circuits sharing I/O drivers and pins with other "normal" or functional circuits. This tends to make debugging very slow and complex, due to the loading and the fact that the circuitry sharing the I/O drivers is sometimes the very circuitry that needs to be debugged. It also consumes expensive die space and can interfere with the I/O used in normal operation if the circuits to be debugged are the ones which share the I/O. Moreover, this method still requires a considerable number of dedicated debug I/O pins, for example, signals which can not be phase muxed. The lower performance of this method also requires more bits for debug, and thus, more pads and pins are needed for debug.

Another commonly used debug method is referred to as piggy backing or low visibility phase muxing, which involves using shared I/O drivers during normal operation only when they are idle. The disadvantages of piggy backing are complexity, cost and lower observability.

Another commonly used method for debugging is to use dedicated pins, which obviously is very expensive when pins are at a premium. Moreover, debug I/O is present on every chip and gets shipped with every chip sold, although they are only used during the rigorous testing or characterization in the lab. Pin count dominates package cost and is the cost driver index vendors use when pricing their packages. Accordingly, this is an extremely expensive debug solution.

Accordingly, there is a need in the field of semiconductor design for a method of debug testing that is higher in performance, that has fewer parasitic losses, and that requires fewer die pads and fewer package I/O pins. There is also a need for the ability to observe internal chip operation at very high speed and very high performance levels, while at the same time saving die space, package I/O pins and cost.

SUMMARY OF THE INVENTION

The present invention comprises a semiconductor with dedicated wire bond sites that are routed and via'd only to a top surface of the semiconductor package to flush mount pads where they are probed during debug, thus reducing the overall inductance and capacitance of the path from the wire bond site to the debug probing site over conventional debug testing by means of dedicated pins on the semiconductor package. This design permits higher performance debug data capture, while at the same time decreasing the number of expensive pins that are necessary for debug.

BRIEF DESCRIPTION OF THE DRAWINGS

The above and other objects, features and advantages of the present invention will be better understood by reading the following more particular description of the invention, presented in conjunction with the following drawings, wherein:

FIG. 3 shows a partial, top perspective view of a high performance debug I/O package according to the present invention.

DETAILED DESCRIPTION OF THE PREFERRED EMBODIMENT

Figure 1:
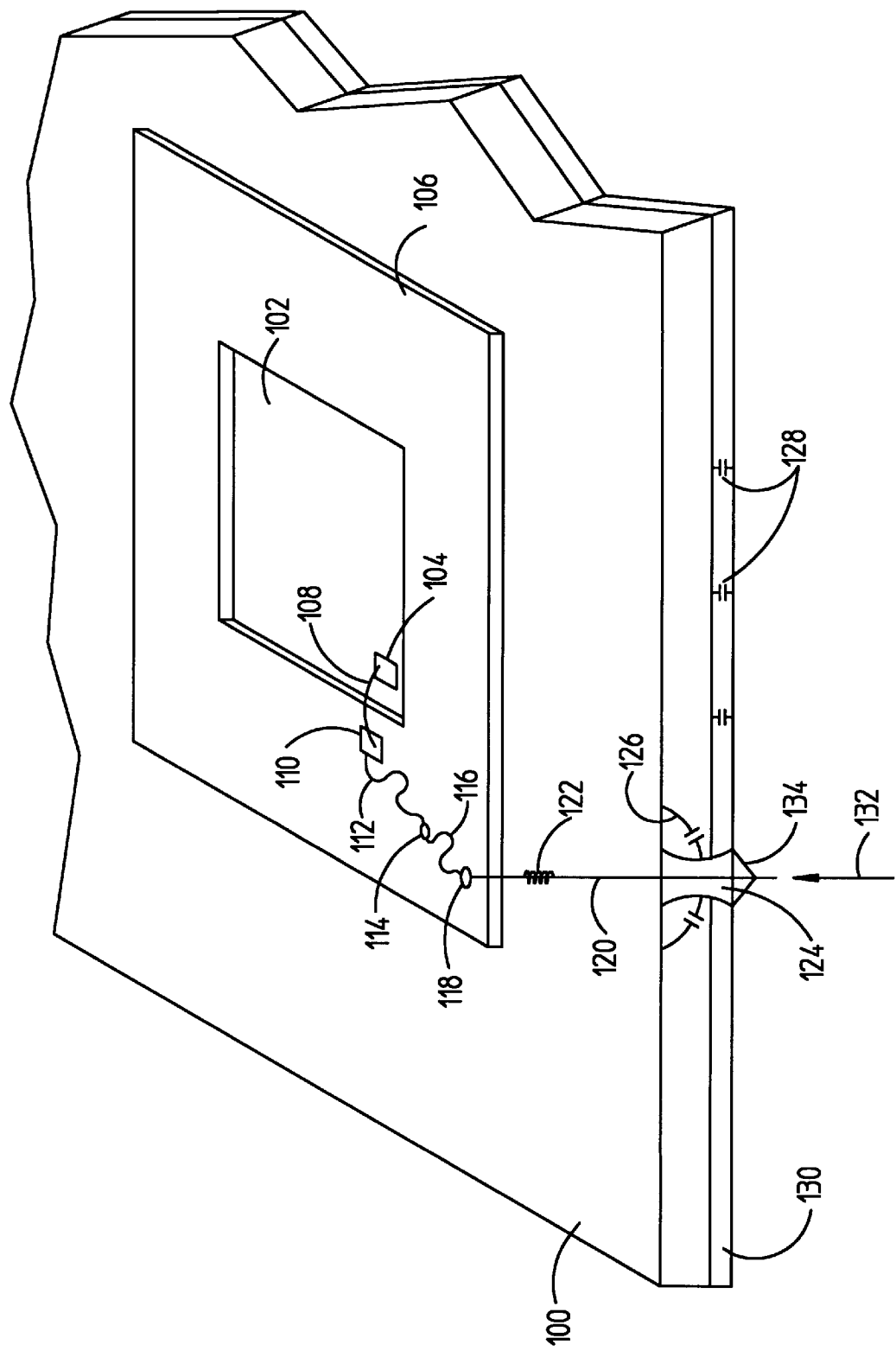
FIG. 1 shows a cross-sectional, perspective view of an I/O pin of a semiconductor package on a PC board during debug testing.

FIG. 1 shows package 106 with die 102 on printed circuit (PC) board 100 during debug testing. Package 106 has a dedicated debug I/O pin 120. Die 102 has an I/O pad 104 that is connected to pad 110 of package 106 via wire 108. Pad 110 is connected to through hole 114, which may connect to another plane in package 106, via trace 112. Through hole 114 is then connected to package I/O pad 118 via trace 116. Package I/O pin 120 is connected to package I/O pad 118. When package 106 is placed onto PC board 100, I/O pin 120 is placed in PC board through hole 124 and soldered on the back side of the PC board at 134. During debug test, I/O pin 120 is probed on the under side of PC board 100 at 134.

There are various capacitances and inductances between I/O pin 120 and the surrounding I/O pins (not shown) of package 106, the various planes 130 and traces (not shown) of the PC board, the through hole 126, and the solder 134. All of these capacitances and inductances cause a degradation in performance, which only increases with increased speed, density and complexity. Generally, because of the lower performance of such tests, due to the various parasitic losses, a more complex debug design must be utilized which generally requires more die space, more die pads, and more package I/O pins. It should also be noted that with decreased size, die space and die pads are at a premium similar to package I/O pins.

Figure 2:
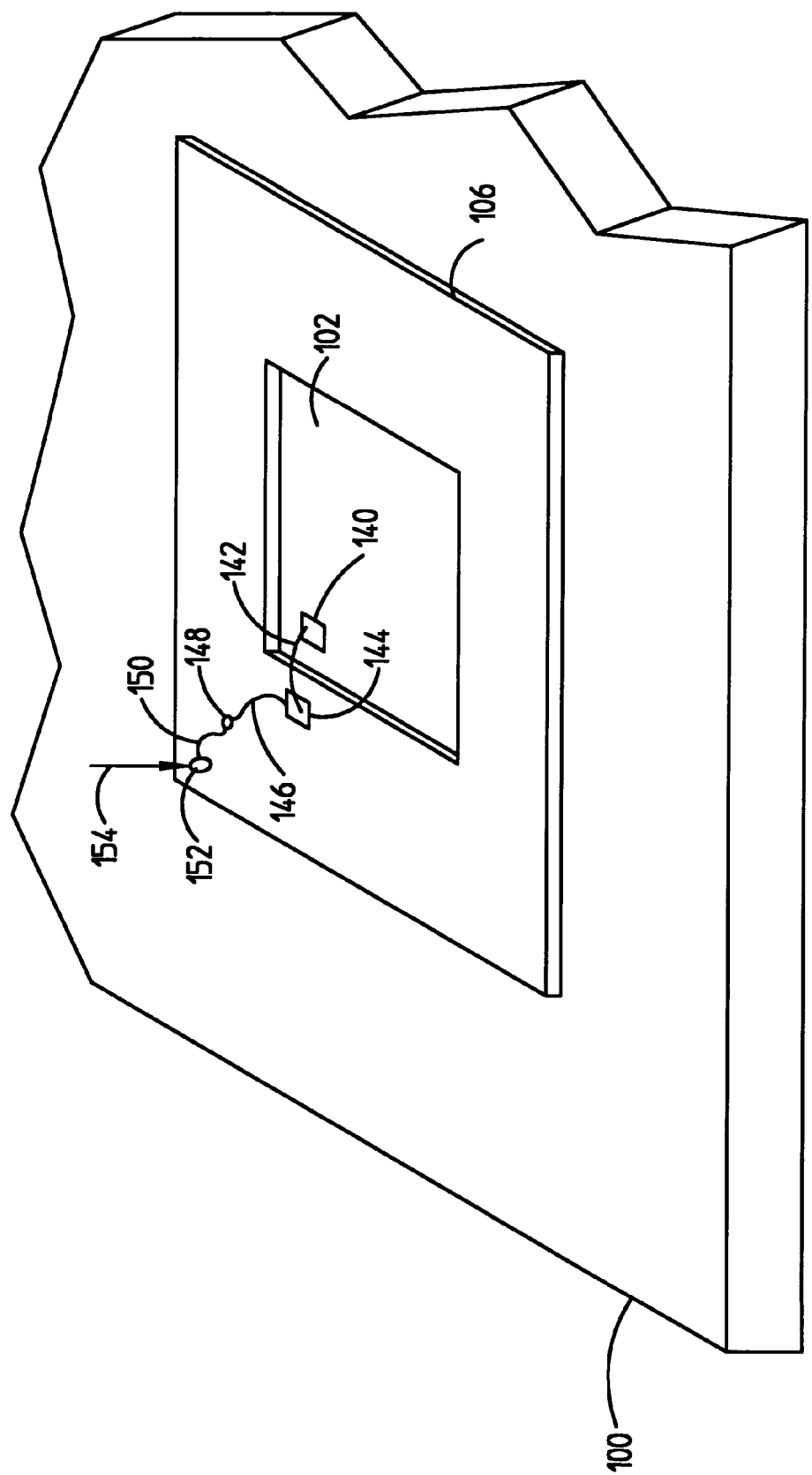
FIG. 2 shows a cross-sectional, perspective view of a high performance, debug I/O of a semiconductor package on a PC board during debug testing according to the present invention.

FIG. 2 illustrates the present invention employing top side probing of a package for debug testing. FIG. 2 shows a semiconductor package 106 mounted on a printed circuit board 100. Semiconductor package 106 has a die 102 therein. Die 102 has a debug pad 140 that is connected to pad 144 on package 106 via wire 142. Pad 144 of package 106 is connected to a through hole 148 that connects to another plane in the package 106 via trace 146. Through hole 148 is connected to debug pad 152 on a top surface of package 106 via trace 150. Debug pad 152 is then accessed for debug testing at 154.

Because the debug pads 140 are routed to the top surface of the package 106 for top side probing, this debug scheme does not have the parasitic capacitances and inductances associated with routing the debug pads to dedicated pins on the bottom of the package and then through the PC board as in the case of FIG. 1. Accordingly, the result is an extremely high performance debug scheme, which requires a greatly reduced debug design and fewer pins for debug than that of FIG. 1 or other known debug techniques. It should be noted that this technique will probably require more pads on the die as it does not involve phase muxing. However, wire bond sites in a package have a negligible impact on the package cost, die pads are cheap in high density designs and packages are now becoming less pad limited due to smaller pad pitch.

FIG. 3 illustrates a perspective view of a semiconductor package according to the present invention. FIG. 3 shows a package 200 with I/O pins 202, top side, flush debug pads 204 and heat slug 206. All pads on the die are bonded to the package, but only those necessary for normal operation of the die are routed to the package pins. Those pads used for debug only are routed and via'd to top side flush mount pads which may cover the surface of the package if necessary, or more probably will surround a heat slug on the top surface of the package. Debug probing then occurs on the top side of the package. Typically, debug will be performed by electrical test equipment, such as a logic analyzer, an oscilloscope or an emulator.

After debug, a heat sink may be attached to the heat slug and cover the flush debug pads of the package. Also a smaller or a specially designed heat sink may be attached that will permit debug to occur while the heat sink is still attached to the heat slug. In a preferred embodiment, the present invention would be implemented in a ceramic PGA package. However, the present invention may be implemented in a plastic PGA, a flip chip, solder bump, or any other now known or later developed package in which signals can be routed, via'd and ported out to the top side of the package. It should be further noted that the debug wire bond pads in the package are only routed to the debug pads on the top surface of the package; they are not routed to any of the pins or leads on the bottom of the package.

In short, this invention takes advantage of the space on the top side of the package to provide high performance debug I/O at a very low cost, which saves precious pin count for functional circuit I/O. Performance is increased because the inductance and capacitance of the pin, mounting through-hole, and PC board trace are not present. This allows more data to be viewed each clock cycle. Complexity of debug design and die space/cost are reduced since the circuitry required to phase mux onto existing busses is not required. Fewer bits are required for full visibility since the bandwidth is so high. Simulations suggest it is possible to reliably output data at speeds above 667 MHz, which may allow 4 sets of data output per clock cycle, depending on the clock speed of the particular chip.

The foregoing description of the present invention has been presented for purposes of illustration and description. It is not intended to be exhaustive or to limit the invention to the precise form disclosed, and other modifications and variations may be possible in light of the above teachings. For example, if a heat sink is not necessary, the debug pads can cover the top surface of the package, rather than along one side of the heat sink or surrounding the heat sink. The flush mounted debug pads do not need to be round as shown in FIGS. 2 and 3, but may be any size and shape that current pitches and debug probing will permit. Also, any type of package that permits the routing of debug pads to the top of the package may be used. Therefore, it should be noted that any known package, such as dual in line packages, or J-lead packages, or even plastic packages would work as well as a ceramic PGA to implement the present invention, as long as the debug wire bond pads can be routed to the top surface of the package. It should also be noted that the present invention could also be implemented with modular hybrid or multi-chip packages.

The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. An electrical device comprising:
    a package, said package adapted for being mounted on a printed circuit board, said printed circuit board having a first side and a second side, said package comprising:
        a body having a first surface and a second surface for housing an integrated circuit die;
        conductive I/O leads or pins on said first surface of said package body;
        I/O wire bond pads on said second surface of said body, said I/O wire bond pads electrically connected to conductive I/O leads or pins on said first surface of said package body;
        debug pads on said second surface of said package body; and
        debug wire bond pads on said second surface of said body, said debug wire bond pads electrically connected to said debug pads on said second surface of said package body, wherein when said package is mounted on said first side of said printed circuit board, said debug pads are accessible from said first side of said printed circuit board pads outputting sets of debug data during debug testing.

2. The electrical device according to claim 1 wherein more than one set of debug data may be output on said debug pads per clock cycle during debug testing.

3. The electrical device according to claim 1 wherein multiple sets of debug data may be output on said debug pads per clock cycle during debug testing.

4. The electrical device according to claim 1 and further comprising:
    a die having I/O pads and debug pads, said die housed in said package body, wherein said I/O pads of said die are connected to said I/O bond pads in said package body and are electrically connected to said conductive I/O leads or pins on said first surface of said package body, wherein said debug pads of said die are connected to said debug wire bond pads in said package body and are electrically connected to said debug pads on said second surface of said package body, wherein said debug wire bond pads are not routed to any of the I/O leads or pins on the first surface of said package body, and wherein said debug pads are dedicated debug testing pads and there is no phase muxing of debug pads with other circuit I/O pads.

5. The electrical device according to claim 1, wherein the electrical connection between said debug wire bond pads and said debug pads is on a single surface of said body and does not pass through said body, and wherein there is no phase musing between said debug pads and I/O pads on said electrical device.

6. A method of performing debug testing on an electrical device, said method comprising the following steps:
    (a) exiting at least one I/O lead or pin on a first surface of said electrical device mounted on a printed circuit board with a signal;
    (b) accessing said signal via debug pads on a second surface of said electrical device mounted on a printed circuit board, wherein said debug pads are accessed from a top surface of said printed circuit board, wherein said accessing of said debug pads is direct and does not run through said printed circuit board, wherein said signal accessed at said debug pads comprises multiple sets of debug data per clock cycle during debug testing; and (c) debugging circuitry in said electrical device with electrical test equipment using said signal accessed at said debug pads on said second surface of said electrical device.

* * * * *

UNITED STATES PATENT AND TRADEMARK OFFICE
CERTIFICATE OF CORRECTION

PATENT NO. : 5,949,136  Page 1 of 1
DATED : September 7, 1999
INVENTOR(S) : Samuel K. Hammel It is certified that error appears in the above-identified patent and that said Letters Patent is hereby corrected as shown below:

<u>Column 4,</u>
Line 30, after "circuit board" insert -- , said debug --

Signed and Sealed this

Twenty-second Day of October, 2002

Attest:

Attesting Officer

JAMES E. ROGAN
*Director of the United States Patent and Trademark Office*